(12) United States Patent
Yu

(10) Patent No.: US 6,372,585 B1
(45) Date of Patent: Apr. 16, 2002

(54) SEMICONDUCTOR DEVICE METHOD

(75) Inventor: Ning Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,181

(22) Filed: Sep. 24, 1999

Related U.S. Application Data

(60) Provisional application No. 60/101,906, filed on Sep. 25, 1998.

(51) Int. Cl.[7] .......................... H01L 21/00; H01L 21/84; H01L 21/336
(52) U.S. Cl. .......................... 438/301; 438/301; 438/305
(58) Field of Search ................... 438/162, 199, 438/301, 305, 423, 682

(56) References Cited

U.S. PATENT DOCUMENTS

| | | | | |
|---|---|---|---|---|
| 4,584,026 A | * | 4/1986 | Wu et al. ................ | 148/1.5 |
| 5,585,286 A | * | 12/1996 | Aaronowitz et al. .......... | 437/24 |
| 5,717,238 A | * | 2/1998 | Aronowitz et al. ......... | 257/336 |
| 5,811,343 A | * | 9/1998 | Wann et al. ................ | 438/305 |
| 5,875,975 A | * | 3/1999 | Karlsson et al. ............ | 438/162 |
| 5,994,175 A | * | 11/1999 | Gardner et al. ............. | 438/199 |
| 6,037,639 A | * | 3/2000 | Ahmad ........................ | 257/401 |
| 6,054,386 A | * | 4/2000 | Prabhakar .................... | 438/682 |
| 6,069,054 A | * | 5/2000 | Choi ........................... | 438/423 |

* cited by examiner

*Primary Examiner*—John F. Niebling
*Assistant Examiner*—Walter L Lindsay, Jr.
(74) *Attorney, Agent, or Firm*—Carlton H. Hoel; W. James Brady; Frederick J. Telecky, Jr.

(57) ABSTRACT

This invention is to a method for producing a uniform nitrogen doped layer in silicon that effectively reduces boron transient enhanced diffusion (TED) for ultra shallow junction formation. A silicon substrate (10) from an n-type single crystal silicon grown in the [100] direction and cut into wafers with (100) faces exposed is pre-amorphized by silicon and germanium implantation (11). Nitrogen is implanted to a depth of 0.7 $\mu$m through the amorphous layer with multiple implantations at energies ranging from 10 keV to 250 keV (12). Boron is implanted into the pre-amorphized and nitrogen contained silicon substrate (13). After boron implantation, the substrate is subjected to a rapid thermal anneal process to remove lattice damage and activate boron. The resulting nitrogen and boron profiles (14) in the substrate of this invention exhibit suppressed boron TED and enable formation of p⁺ ultra shallow junctions.

4 Claims, 4 Drawing Sheets

US 6,372,585 B1

SEMICONDUCTOR DEVICE METHOD

This application claims benefit of Provisional Application Ser. No. 60/101,906 filed Sep. 25, 1998.

FIELD OF THE INVENTION

This invention relates to semiconductor processing for fabricating p+ ultra shallow junctions in p+ source/drain (S/D) and S/D extensions.

BACKGROUND OF THE INVENTION

Scaling down the design rules of ULSI devices requires a reduction of the junction depths in order to suppress short channel effects. Failing to properly scale junction depths can result in unacceptable increase in circuit power consumption. For sub-quarter micron devices, S/D junction depths below 100 nm are required. Additionally, these junctions must have low sheet resistance for the maintenance of high currents and resultant high speeds in the devices. For devices smaller than 0.18 μm, achieving low S/D contact resistivity is a serious challenge in junction technology.

The doping requirements of the advanced ultra large scale integration (ULSI) devices are very stringent. These must be addressed by process development and innovations. Commercially viable mass production of ULSI devices requires fabrication of ultra-shallow low resistance p+ source/drain (S/D) junctions, S/D extensions, and p-type doping of polysilicon gate contacts.

There are several approaches for forming shallow p+/n junctions. Low energy ion implantation of boron has focused on forming p+ S/D junctions as shallow as 100 nm. This approach has not proven satisfactory because of channeling and transient enhanced diffusion (TED) of boron. Boron diffusivity in silicon is strongly enhanced in the presence of silicon interstitials which accumulate during ion implantation and cause TED of the boron. Although boron TED disappears when most of the silicon interstitials are annealed out, it is responsible for additional increase of the p+/n junction depth of 200 to 500 nm. The junction depth increase associated with TED depends mostly upon annealing strategy and is almost independent of the boron implant energy at 0.5 keV to 2 keV range. Low energy (sub-1 keV) boron implant is required for the fabrication flexibility demanded by post implant anneal conditions. $BF_2$ implant has been used to form p+ S/D regions. The main advantages of $BF_2$ compared with boron are a reduced effective boron energy and significant amorphization of the surface silicon which suppresses boron channeling and reduces the p+/n junction depth. The presence of fluorine in the structure has been found to enhance the diffusion of boron from a polysilicon gate stack electrode through a thin (sub-10 nm) gate oxide into a channel region causing uncontrolled shifts in the MOS transistor threshold voltage.

The presence of fluorine and the peroxy linkage defect (≡—Si—O—O—Si≡) characterized by a large Si—Si separation of approximately 0.5 nm, mediates boron diffusion forming O—B—O bridging molecule in $SiO_2$ structures.

Another disadvantage from $BF_2$ implanted silicon is the generation of rather high density (~$10^8$ cm$^{-2}$) of stacking faults. The density of the stacking faults has a non-linear dependence on $BF_2$ dosage. Perhaps, $BF_2$ splits into its component elements when it hits the target surface. Therefore, the energy of the molecule is shared by the elements according to their mass ratio. The simultaneous implantation of the B and F elements amount to higher dose rate implantation compared to the sequential implantation of individual elements. Therefore, the damage produced by $BF_2$ implant is higher than that of B implant with equivalent energy and dose.

Rapid thermal annealing (RTA) is very effective for eliminating the ion implantation induced defects while suppressing the dopant diffusion. It is a developing technology with increasing use for ultra-shallow junction formation.

Another approach is to form an elevated S/D structure by selective epitaxy growth (SEG). The epitaxial silicon can be doped as it is grown, or it can be subsequently implanted. This approach will require high temperature processing or an ion implanter built especially for low energy performance due to the variety of process integration and the dependence of implantation energy on SEG thickness.

Preamorphization with an electrically inactive species is very effective in suppressing the boron channeling tail. However, additional amounts of silicon interstitials are produced below the original amorphous/crystal interface, resulting in additional TED as compared to boron implantation into crystalline silicon. Preamorphization implants must be chosen very carefully to suppress TED or junction leakage.

The incorporation of nitrogen into the gate oxide has been shown to have significant beneficial effects, including suppressing boron TED from doped polysilicon gate electrodes to Si—$SiO_2$ interfaces.

Since nitrogen is a Group V element, donor activity might be expected for substitutional nitrogen in silicon. However, its low equilibrium solubility (4.5×$10^{15}$ atoms/cm$^3$) and small donor activation (<1%), N-ion implantation is predominantly used to form diffusion barriers. Typical implantation doses are 1×$10^{13}$ to 1×$10^{18}$ atoms/cm$^2$ which give peak nitrogen concentrations of 5×$10^{17}$ to 5×$10^{22}$ atoms/cm$^3$ at 100 keV implantation energy. The effect of implanted nitrogen on the crystalline quality depends on implantation dosage and energy. At 100 keV implantation energy, for doses less than 2×$10^{15}$ atoms/cm$^2$ silicon remains crystalline for implantation near 300K. For doses larger than the above at similar implantation energy, composites of amorphous silicon and SiN are produced from which $Si_3N_4$ precipitates appear upon subsequent annealing at temperatures >1300K. If doses >8×$10^{17}$ atoms/cm$^2$ are used, nitrogen is trapped, which can cause blistering, and can produce a continuous layer of $Si_3N_4$ with subsequent high temperature anneals.

SUMMARY OF THE INVENTION

The invention provides a nitrogen doping with multiple implants at various energy levels at low doses to produce a uniformly doped nitrogen layer followed by boron doping. The invention recognizes that nitrogen implantation by a single dose can lead to nonuniform accumulation of nitrogen at the Si—$SiO_2$ interface and can produce a nitrogen related defect (≡Si—O—N—O—Si≡) similar to the peroxy linkage defect.

The invention has an advantage of suppressing boron transient enhanced diffusion (TED) and thus enabling ultra shallow (0.05 μm) junction formation.

DESCRIPTION OF PREFERRED EMBODIMENTS

Figure 1A:
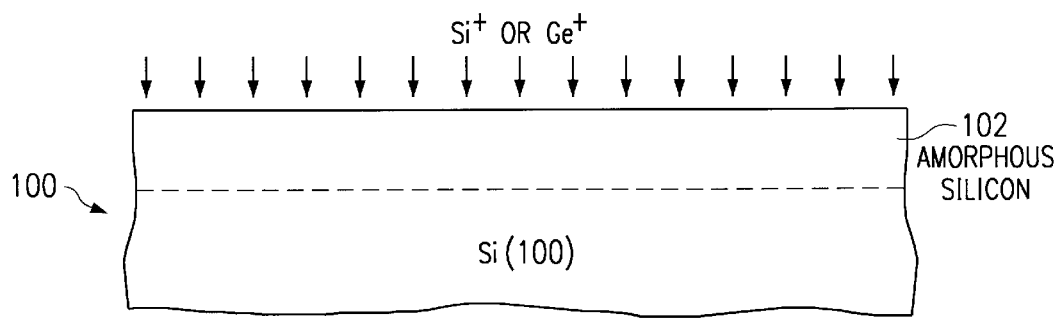
FIGS. 1a–1d show the process steps of a preferred embodiment.
Figure 1B:
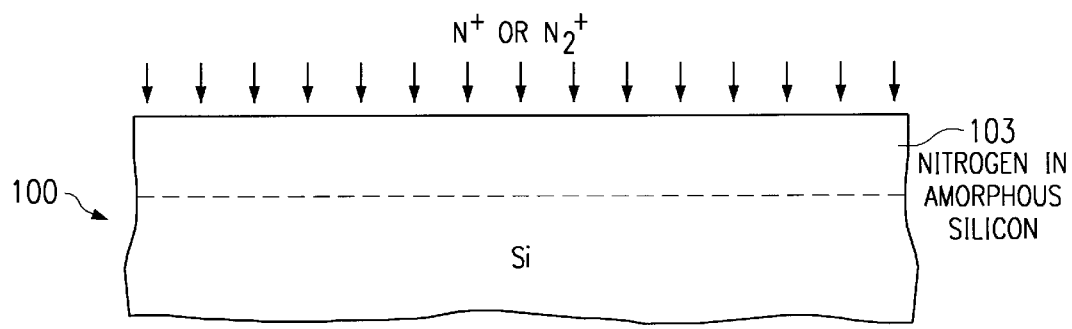
Figure 1C:
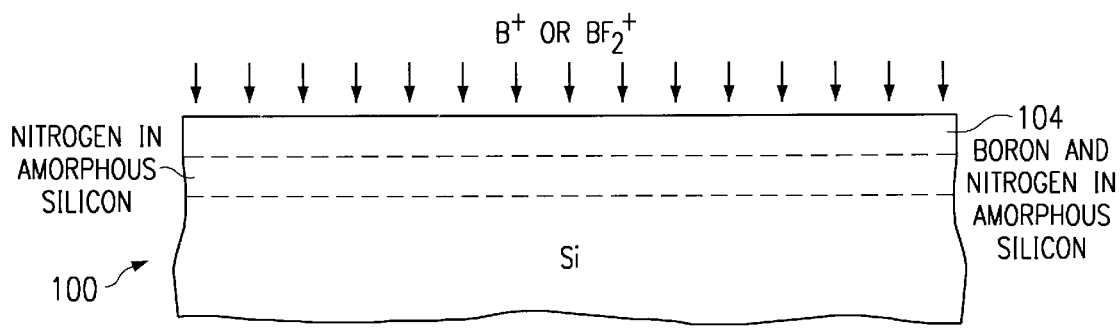
Figure 1D:
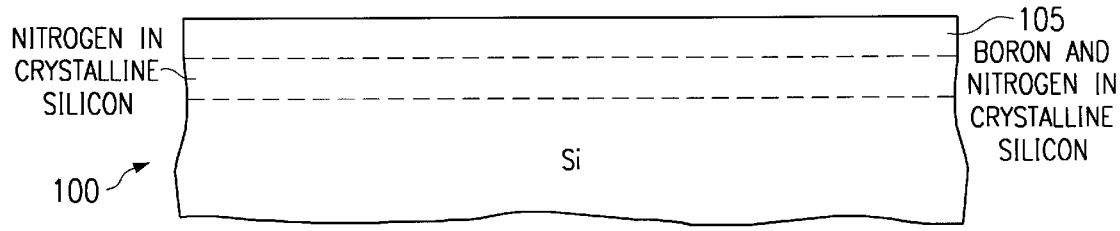

A first preferred embodiment is shown in FIG. 1. This embodiment is a method producing a uniform nitrogen doped layer in silicon plus subsequent boron implantation that effectively reduces boron transient enhanced diffusion (TED) for ultra shallow junction formation. Silicon substrate 100 from an n-type single crystal silicon grown in the [100] direction and cut into wafers with (100) faces exposed is pre-amorphized in surface layer 102 roughly 0.7 um deep by silicon and germanium implantation; see FIG. 1a. Nitrogen is implanted uniformly to a depth of 0.7 um through the amorphous layer 102 with multiple implantations at energies ranging from 10 keV to 250 keV; see FIG. 1b showing surface layer 103 of nitrogen implanted amorphous silicon. Of course, other amorphous and nitrogen depths could be used, such as 0.1 um to 1.2 um. Then boron is implanted into the upper portion of pre-amorphized and nitrogen containing silicon layer 103 to form surface layer 104; see FIG. 1c. The boron is implanted at a single energy and has a roughly gaussian depth distribution in contrast to the roughly uniform nitrogen depth distribution. Various boron depths may be used, such as 0.03 um to 0.1 um. After boron implantation, the substrate is subjected to a rapid thermal anneal process to remove lattice damage (crystallize the amorphous silicon) and activate boron; see FIG. 1d. The resulting nitrogen and boron profiles (roughly uniform and gaussian, respectively) in the substrate exhibit suppressed boron TED and enable formation of $p^+$ ultra shallow junctions.

Figure 2A:
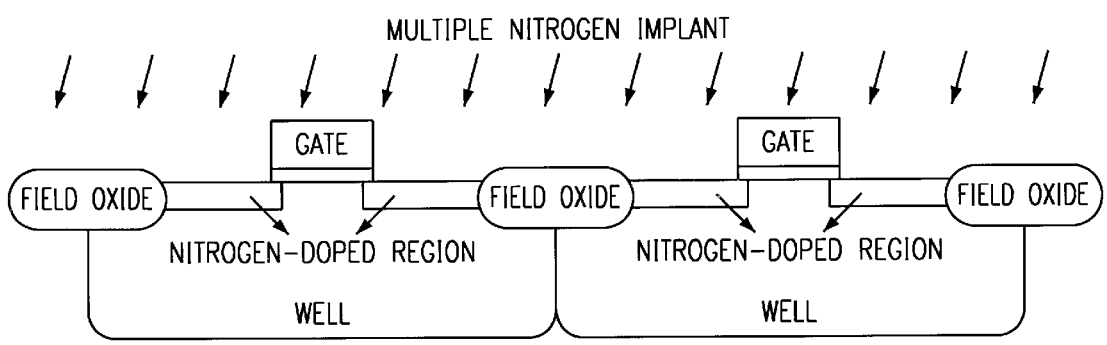
FIGS. 2a–2b are cross sectional view of the shallow junctions fabricated by a preferred embodiment.
Figure 2B:
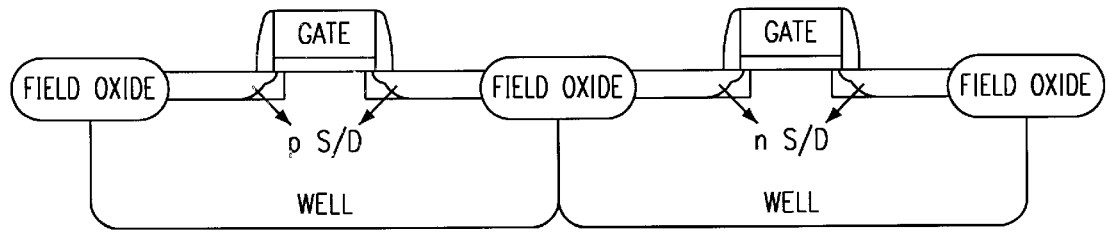

FIGS. 2a–2b are cross sectional view of the shallow junctions fabricated by the invention. Cross sectional view of nitrogen doped regions (FIG. 2a) and cross sectional view of the shallow junction formation (FIG. 2b) are presented.

Preamorphization by germanium or silicon implants is optional for multi-nitrogen implant to suppress boron TED.

Figure 3A:
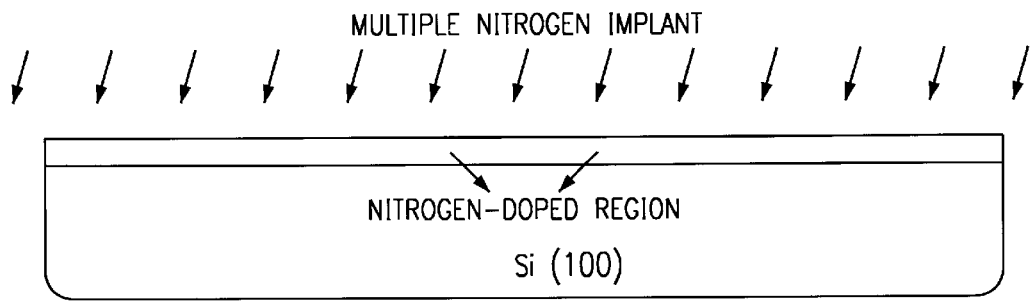
FIGS. 3a–3c show simplified process steps of the method of a preferred embodiment.
Figure 3B:
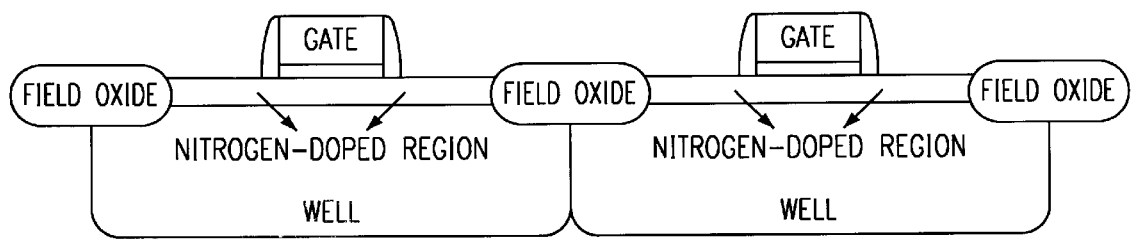
Figure 3C:
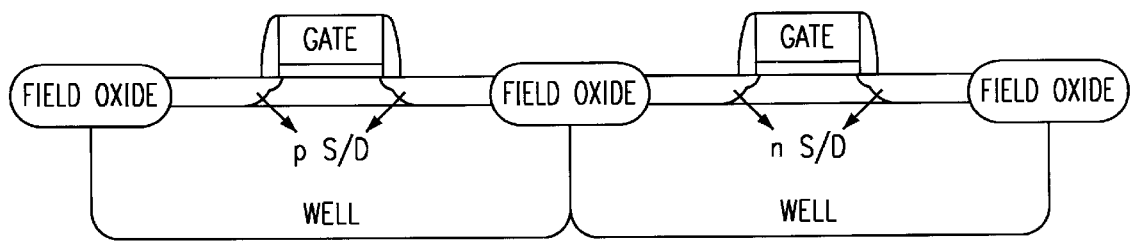

FIGS. 3a–3c are cross sections showing a simplified process steps of the method of the preferred embodiments. Cross sectional views and the fabrication steps are presented. A silicon substrate (FIG. 3a) from an n-type single crystal silicon grown in the [100] direction and cut into wafers with (100) faces exposed is implanted by multiple nitrogen implantation to a depth of 0.1–0.65 um (FIG. 3a) at energies ranging from 10 keV to 250 keV. Boron is implanted into the nitrogen-contained regions to a depth of 0.05 um (FIG. 3c).

Figure 4:
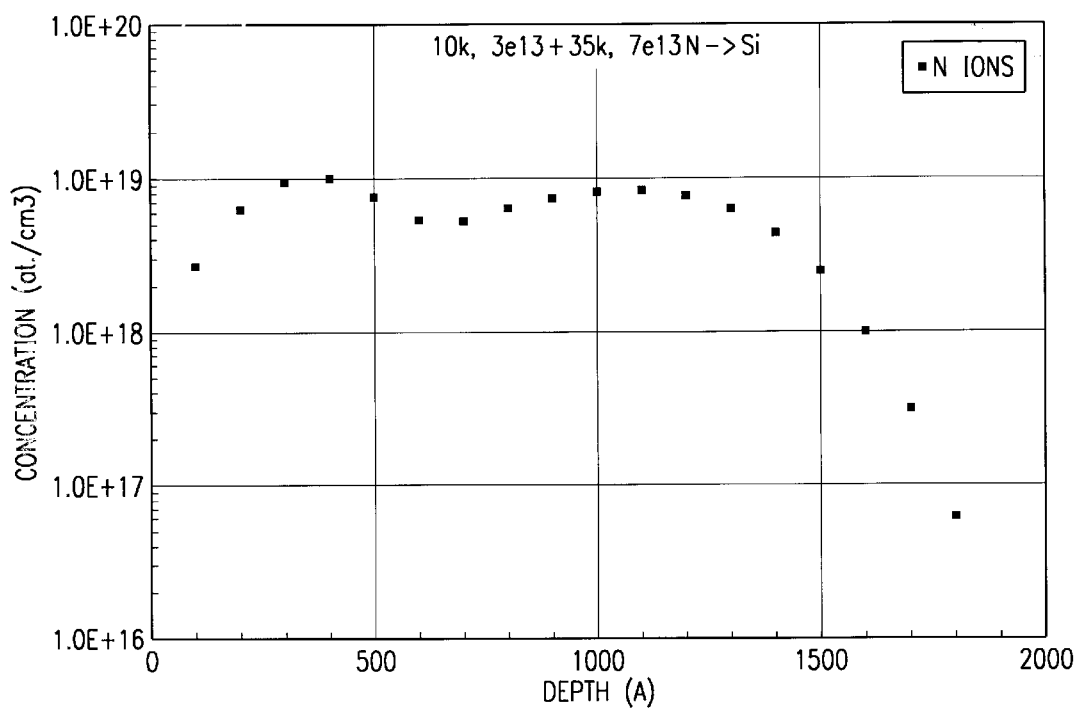
FIGS. 4 and 5 show the nitrogen concentration profile produced by multiple nitrogen implants of a preferred embodiment.
Figure 5:
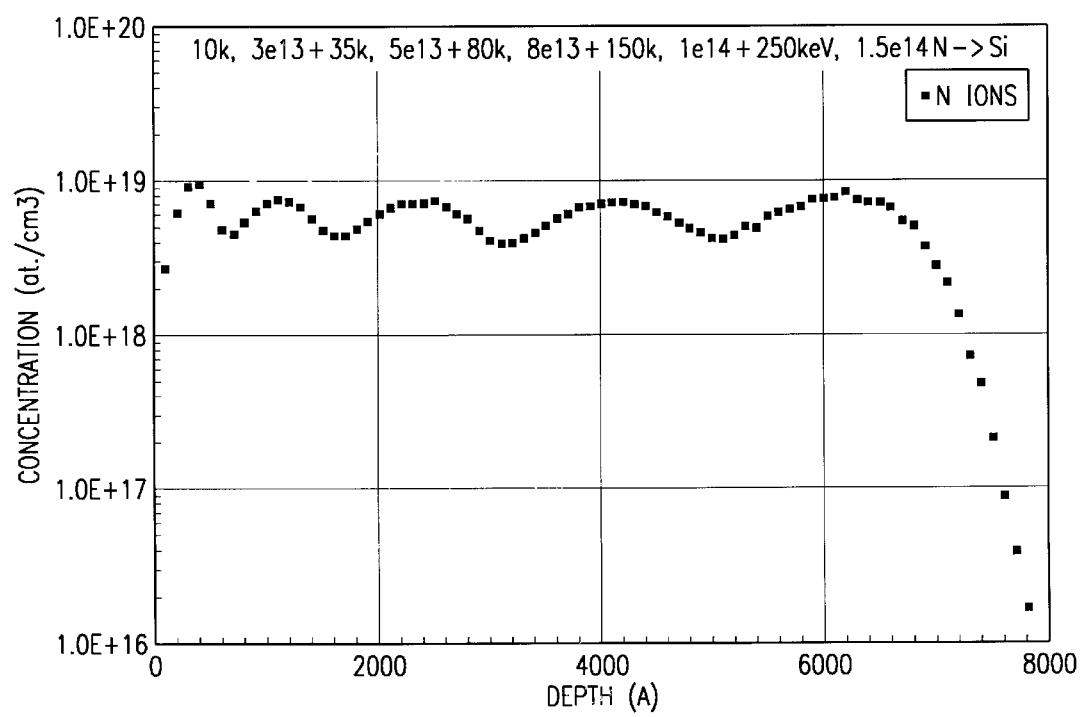

FIGS. 4 and 5 show the nitrogen concentration profile produced by multiple nitrogen implants of different preferred embodiments. The concentration of nitrogen not exceeding $1\times10^{19}$ atoms/cm$^3$ and the uniform distribution of nitrogen in the doped regions are important considerations which are successfully achieved by the preferred embodiments.

EXAMPLES

Example 1

An amorphous layer was formed by silicon pre-amorphization implant into silicon substrates from an n-type single crystal silicon grown in the [100] direction and cut into wafers with (100) faces exposed. The preamorphized wafers were divided into two separate lots. Into one of the lots (wafer #14), uniform doping of nitrogen was obtained by multiple nitrogen implantation of the invention with a total dose of less than $5\times10^{14}$ atoms/cm$^2$. This produced a low concentration (~$1\times10^{19}$ atoms/cm$^3$) of nitrogen doping. Nitrogen in the doped regions was uniformly distributed. Into the other lot (wafer #13), nitrogen was implanted with a single high dose ($1\times10^{15}$ to $1\times10^{16}$ atoms/cm$^2$). This produced a high concentration of nitrogen doping which was not uniformly distributed. The concentration in the doped regions ranged from $5\times10^{19}$ atoms/cm$^3$ to $1\times10^{20}$ atoms/cm$^3$. Low energy boron was implanted into the nitrogen-doped wafers #13 and #14. Boron implanted wafers were subjected to rapid thermal anneal (RTA) to activate the boron. Junction depths were measured by SIMS analysis. The junction depths were 54 nm for wafer #14 and 58 nm for wafer #13. The sheet resistance of the respective wafers were 533 Ω/□ (wafer #14) and 499 Ω/□ (wafer #13). This example demonstrated that the multiple implantation of nitrogen, which produced low and uniform concentration of nitrogen, was more effective in reducing boron TED than a single nitrogen implant, which produced higher concentration and non-uniform distribution.

Example 2

An amorphous layer was formed by silicon pre-amorphization implant into silicon substrates from an n-type single crystal silicon grown in the [100] direction and cut into wafers with (100) faces exposed. The preamorphized wafers were divided into two separate lots. Into one of the lots (wafer #16), uniform doping of nitrogen was obtained by multiple nitrogen implantation of the invention with a total dose of less than $5\times10^{14}$ atoms/cm$^2$. This produced a low concentration (~$1\times10^{19}$ atoms/cm$^3$) of nitrogen doping. Nitrogen in the doped regions was uniformly distributed. Into the other lot (wafer #18), nitrogen was implanted with a single high dose ($1\times10^{15}$ to $1\times10^{16}$ atoms/cm$^2$). This produced a high concentration of nitrogen doping which was not uniformly distributed. The concentration in the doped regions ranged from $5\times10^{19}$ atoms/cm$^3$ to $1\times10^{20}$ atoms/cm$^3$. The nitrogen doped substrates were furnace annealed at 600 C. Low energy boron was implanted into the nitrogen doped wafers #16 and #18. Boron implanted wafers were subjected to rapid thermal anneal (RTA) to activate the boron. Junction depths were measured by SIMS analysis. The junction depths were 59 nm for wafer #16 and 65 nm for wafer #18. The sheet resistance of the respective wafers were 520 Ω/□ (wafer #16) and 511 Ω/□ (wafer #18). Furnace annealing at 600 C is conventionally done to epitaxially regrow the pre-amorphized layer. This example demonstrated that the multiple implantation of nitrogen, which produced low and uniform concentration of nitrogen, was more effective in reducing boron TED than a single nitrogen implant which produced higher concentration and non-uniform distribution.

Example 3

An amorphous layer was formed by germanium pre-amorphization implant into silicon substrates from an n-type single crystal silicon grown in the [100] direction and cut into wafers with (100) faces exposed. The pre-amorphized wafers were divided into two separate lots. Into one of the lots uniform doping of nitrogen was obtained by multiple nitrogen implantation of the invention with a total dose of less than $5\times10^{14}$ atoms/cm$^2$. This produced a low concentration (~$1\times10^{19}$ atoms/cm$^3$) of nitrogen doping. Nitrogen in the doped regions was uniformly distributed. Into the other lot, nitrogen was implanted with a single high dose ($1 \times 10^{15}$ to $1 \times 10^{16}$ atoms/cm$^2$). This produced a high concentration of nitrogen doping which was not uniformly distributed. The concentration in the doped regions ranged from $5 \times 10^{19}$ atoms/cm$^3$ to $1 \times 10^{20}$ atoms/cm$^3$. Low energy boron was implanted into the nitrogen doped wafers. Boron implanted wafers were subjected to rapid thermal anneal (RTA) to activate the boron. Junction depths were measured by SIMS analysis. The junction depths produced by low concentration and uniformly distributed nitrogen were consistently shallower than those produced by the high nitrogen concentration and non-uniformly distributed substrates. This example demonstrated that the multiple implantation of nitrogen, which produced low and uniform concentration of nitrogen, was more effective in reducing boron TED than a single nitrogen implant which produced higher concentration and non-uniform distribution.

Example 4

An amorphous layer was formed by germanium preamorphization implant into silicon substrates from an n-type single crystal silicon grown in the [100] direction and cut into wafers with (100) faces exposed. The pre-amorphized wafers were divided into two separate lots. Into one of the lots, uniform doping of nitrogen was obtained by multiple nitrogen implantation of the invention with a total dose of less than $5 \times 10^{14}$ atoms/cm$^2$. This produced a low concentration ($\sim 1 \times 10^{19}$ atoms/cm$^3$) of nitrogen doping. Nitrogen in the doped regions was uniformly distributed. Into the other lot, nitrogen was implanted with a single high dose ($1 \times 10^{15}$ to $1 \times 10^{16}$ atoms/cm$^2$). This produced a high concentration of nitrogen doping which was not uniformly distributed. The concentration in the doped regions ranged from $5 \times 10^{19}$ atoms/cm$^3$ to $1 \times 10^{20}$ atoms/cm$^3$. Nitrogen doped substrates were furnace annealed at 600 C. Low energy boron was implanted into the nitrogen doped wafers. Boron implanted wafers were subjected to rapid thermal anneal (RTA) to activate the boron. Junction depths were measured by SIMS analysis. The junction depths produced by low concentration and uniformly distributed nitrogen were consistently shallower than those produced by the high nitrogen concentration and non-uniformly distributed substrates. This example demonstrated that the multiple implantation of nitrogen, which produced low and uniform concentration of nitrogen, was more effective in reducing boron TED than a single nitrogen implant which produced higher concentration and non-uniform distribution.

Example 5

Silicon substrates without preamorphization from n-type single crystal silicon grown in the [100] direction and cut into wafers with (100) faces were divided into two separate lots. Into one of the lots, uniform doping of nitrogen was obtained by multiple nitrogen implantation of the invention with a total dose of less than $5'10^{14}$ atoms/cm$^2$. This produced a low concentration ($\sim 1 \times 10^{19}$ atoms/cm$^3$) of nitrogen doping. Nitrogen in the doped regions was uniformly distributed. Into the other lot, nitrogen was implanted with a single high dose ($1 \times 10^{15}$ to $1 \times 10^{16}$ atoms/cm$^2$). This produced a high concentration of nitrogen doping which was not uniformly distributed. The concentration in the doped regions ranged from $5 \times 10^{19}$ atoms/cm$^3$ to $1 \times 10^{20}$ atoms/cm$^3$. Low energy boron was implanted into the nitrogen doped wafers. Boron implanted wafers were subjected to rapid thermal anneal (RTA) to activate the boron. Junction depths were measured by SIMS analysis. The junction depths produced by low concentration and uniformly distributed nitrogen were consistently shallower than those produced by the high nitrogen concentration and non-uniformly distributed substrates. This example demonstrated that the multiple implantation of nitrogen, which produced low and uniform concentration of nitrogen, was more effective in reducing boron TED than a single nitrogen implant which produced higher concentration and non-uniform distribution.

Example 6

Silicon substrates without preamorphization from n-type single crystal silicon grown in the [100] direction and cut into wafers with (100) faces wafers were divided into two separate lots. Into one of the lots, uniform doping of nitrogen was obtained by multiple nitrogen implantation of the invention with a total dose of less than $5 \times 10^{14}$ atoms/cm$^2$. This produced a low concentration ($\sim 1 \times 10^{19}$ atoms/cm$^3$) of nitrogen doping. Nitrogen in the doped regions was uniformly distributed. Into the other lot, nitrogen was implanted with a single high dose ($1 \times 10^{15}$ to $1 \times 10^{16}$ atoms/cm$^2$). This produced a high concentration of nitrogen doping which was not uniformly distributed. The concentration in the doped regions ranged from $5 \times 10^{19}$ atoms/cm$^3$ to $1 \times 10^{20}$ atoms/cm$^3$. Nitrogen doped substrates were furnace annealed at 600° C. Low energy boron was implanted into the nitrogen-doped wafers. Boron implanted wafers were subjected to rapid thermal anneal (RTA) to activate the boron. Junction depths were measured by SIMS analysis. The junction depths produced by low concentration and uniformly distributed nitrogen were consistently shallower than those produced by the high nitrogen concentration and non-uniformly distributed substrates. This example demonstrated that the multiple implantation of nitrogen, which produced low and uniform concentration of nitrogen, was more effective in reducing boron TED than a single nitrogen implant which produced higher concentration and non-uniform distribution.

Modifications

Two major absorption bands at 766 and 963 cm$^{-1}$ are introduced by nitrogen implantations of the order of $1 \times 10^{15}$ atoms/cm$^2$ at energies ranging from 60 to 180 keV into silicon. The intensities of these bands increase upon subsequent furnace annealing at 600 C, and increase even further upon laser annealing. For silicon doped with nitrogen in the melt, the predominant banding configuration is the same as for the implanted silicon. This indicates that nitrogen doped substrates or epitaxially grown silicon films predoped with nitrogen can also be utilized to resolve boron TED problem.

For the preferred embodiments, several other variants of introducing nitrogen into silicon might also be suggested from the manner nitrogen bonds in silicon. Although nitrogen in crystalline silicon is predominantly bonded in pairs, a small fraction (~10%) of implanted nitrogen can be bonded into an off-center substitutional site by rapid quenching from the melt. Similar bonding also occurs by pulsed laser annealing of implanted nitrogen.

What is claimed is:

1. A method for fabricating shallow boron-doped junctions, comprising the steps of:
   pre-amorphizing a silicon layer,
   implanting at least two doses of nitrogen of differing energies into said silicon layer,
   implanting boron into said silicon layer.
2. The method of claim 1, wherein:

(a) said implanting nitrogen also pre-amorphizes said silicon layer.

3. The method of claim 1, wherein:

(a) after said implanting of boron, rapid thermal annealing said silicon layer, whereby said pre-amorphized silicon layer is crystallized.

4. The method of claim 1, wherein:

(a) the nitrogen implants are at energies ranging from 10 keV to 250 keV with doses ranging from $1\times10^{14}$ to $1\times10^{16}$ atoms cm$^{-2}$.

* * * * *